United States Patent

Rauner et al.

[15] 3,647,443

[45] Mar. 7, 1972

[54] LIGHT-SENSITIVE QUINONE DIAZIDE POLYMERS AND POLYMER COMPOSITIONS

[72] Inventors: Frederick J. Rauner; Joseph A. Arcesi; John R. Guild, all of Rochester, N.Y.

[73] Assignee: Eastman Kodak Company, Rochester, N.Y.

[22] Filed: Sept. 12, 1969

[21] Appl. No.: 857,587

[52] U.S. Cl. ........................................96/33, 96/36.3, 96/75, 96/91 D, 260/141

[51] Int. Cl. ..................G03f 7/02, G03c 1/52, C07c 117/00

[58] Field of Search .......................96/91 D, 33, 36, 36.3, 75; 260/141

[56] References Cited

UNITED STATES PATENTS

| | | | |
|---|---|---|---|
| 3,046,120 | 7/1962 | Schmidt et al. | 96/91 X |
| 3,130,048 | 4/1964 | Fritz et al. | 96/91 X |
| 3,184,310 | 5/1965 | Fritz et al. | 96/49 |
| 3,201,239 | 8/1965 | Neugebauer et al. | 96/36 |
| 3,264,104 | 8/1966 | Reichel | 96/33 |
| 3,494,767 | 2/1970 | Laridon et al. | 96/33 |

FOREIGN PATENTS OR APPLICATIONS

| | | |
|---|---|---|
| 1,136,544 | 12/1968 | Great Britain |

*Primary Examiner*—Harold Ansher
*Attorney*—William H. J. Kline, James R. Frederick and Joshua G. Levitt

[57] ABSTRACT

Polyalkylene glycols end-capped with o-quinone diazide groups are a novel class of light-sensitive polymers which range from viscous liquid to waxy materials. The polymers can be used alone or in conjunction with other light-sensitive and nonlight-sensitive polymers to prepare light-sensitive coating compositions. Preparation of photoresists and printing plates using polymer compositions of this invention is described.

23 Claims, No Drawings

LIGHT-SENSITIVE QUINONE DIAZIDE POLYMERS AND POLYMER COMPOSITIONS

This invention relates to light-sensitive polymeric quinone diazides. In a particular aspect, it relates to light-sensitive quinone diazide polymers and their use in the graphic arts to produce photomechanical images such as photoresists and lithographic plates.

The use of light-sensitive quinone diazides for the manufacture of photocopies, for photoresists and on lithographic plates is well known. Exposure to light results in a solubility differential between the exposed and unexposed areas such that treatment with an appropriate solvent results in the desired image area being retained on a support while the undesired areas are washed off the support. Certain quinone diazides such as the known naphthoquinone-1,2-diazide sulfonic acid esters, have a tendency to crystallize from the coated layer, thereby causing faults which will not stand up under some etching conditions.

Quinone diazide materials which are commonly used in the art are monomeric materials. They often are incorporated in an alkali soluble resinous binder or reacted with an alkali soluble resinous material so that they can be used satisfactorily either as a resist material or on printing plates. However, the incorporation of binders dilutes the light-sensitive material and may adversely affect the light-sensitivity and may also result in a reduction in the solubility differential between the exposed and unexposed material.

In an attempt to eliminate the problems associated with the need for a binder with monomeric quinone diazides, there have been developed polymeric quinone diazides in which the light-sensitive quinone diazide moiety is attached to an appropriate polymer. Polymeric quinone diazides are described in U.S. Pat. No. 3,046,120, British Pat. Specification 1,113,759 and U.S. application Ser. No. 684,636, filed Nov. 21, 1967, abandoned after refiling as U.S. application Ser. No. 72,896 on Sept. 16, 1970 which are based on such polymers as phenolic resins and amine-containing resins such as aminostyrene resins. While these polymers have good light-sensitivity and maintain an adequate solubility differential between exposed and unexposed areas, due to the physical characteristics of the polymeric resin, coatings prepared for these polymers are brittle and relatively inflexible.

Accordingly, it is an object of this invention to provide novel polymeric quinone diazides.

It is a further object of this invention to provide novel polymeric quinone diazides with which can be obtained flexible, nonbrittle, light-sensitive layers.

It is another object of this invention to provide novel photosensitive compositions useful in preparing flexible light-sensitive layers which can be used to prepare photomechanical images.

It is still another object of this invention to provide photoresist compositions containing novel polymeric quinone diazides.

It is yet another object of this invention to provide light-sensitive elements bearing a flexible layer of a novel polymeric quinone diazide.

It is yet another object of this invention to provide processes for the production of photomechanical images employing the novel polymers, compositions and elements of this invention.

The above and other objects of this invention will become apparent to those skilled in the art from the further description of this invention In accordance with our invention there is provided a novel class of polymeric quinone diazides which are o-quinone diazide end-capped polyalkylene glycols. These polymeric quinone diazides range from liquid to waxy materials. Depending upon their physical state they can be used alone or in combination with other polymeric materials to produce dry, flexible, light-sensitive coatings. If used in combination with another light-sensitive polymeric quinone diazide which normally gives brittle coatings, the polymers of this invention reduce brittleness and improve the flexibility of the coating without adversely affecting the light sensitivity of the coating.

Polymers of our invention can be prepared by the reaction of a polyalkylene glycol, such as polyethylene glycol or polypropylene glycol with a suitable reactive o-quinone diazide such as an acid ester of a quinone diazide. Such polymeric light-sensitive materials, hereafter referred to as polyalkylene glycol quinone diazides or quinone diazide end-capped polyalkylene glycols, can be incorporated in a coating composition and applied to a support as a solution in an organic solvent. The coating can be exposed imagewise to actinic radiation to decompose the diazo structure in the light struck areas, as indicated by the following generalized reaction:

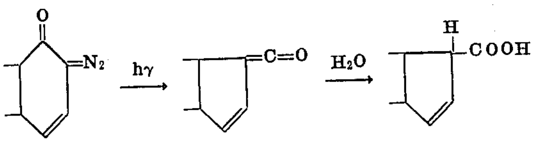

After exposure, the coating is developed to produce a useful image. When used in a positive-working system, to obtain a positive image, a dilute alkali solution is used to dissolve the alkali soluble material formed by the decomposition of the diazo structure in exposed areas of the coating. The exposed areas are washed away leaving a positive image of undecomposed light-sensitive polymer from a positive original.

Polyalkylene glycol quinone diazides of this invention include those which can be represented by the structural formula:

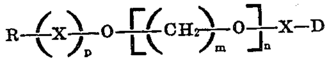

wherein X is a sulfonyl ($-SO_2-$), a carbonyl ($-CO-$), a carbonyloxy $$(-\overset{O}{\overset{\|}{C}}O-)$$

, a sulfinyloxy $$(-\overset{O}{\overset{\|}{S}}O-)$$

or the like linkage; D is an o-quinone diazide group of the benzene series such as a 1,2-benzoquinone diazide, a 1,2-naphthoquinone diazide, a 3,3',4,4'-biphenyl-bis-quinone diazide, a 2,3,-phenanthrenequinone diazide, a 3,4-chrysenequinone diazide and the like, including quinone diazides substituted with such groups as alkyl generally having one to eight carbon atoms, e.g., methyl, ethyl, propyl, butyl, amyl, hexyl, heptyl, octyl, etc., alkoxy generally having 1 to 8 carbon atoms, e.g., methoxy, ethoxy, propoxy, butoxy, amyloxy, hexyloxy, heptyloxy, octyloxy, etc., and the like substituents which do not interfere with the photodecomposition of the quinone diazide; R is a D group, a hydrogen atom, an alkyl group generally having one to 20 carbon atoms or an aryl group of the benzene series, e.g., phenyl, naphthyl, biphenyl, anthryl, including aryl groups substituted with such substituents as halo, nitro, cyano, alkyl generally having one to eight carbon atoms, alkyloxy generally having one to eight carbon atoms, and the like substituents; $p$ is 0 when R is hydrogen and 1 when R is a D group, an alkyl group or an aryl group; $m$ is an integer of 2 through 4; and $n$ is an integer of about 8 through 400 and is preferably an integer of about 10 through 100.

In a preferred embodiment the polyalkylene glycol quinone diazides of this invention are polyethylene glycols end-capped with a 5-sulfonyl-1,2-naphthoquinone-2-diazide wherein in the above formula X is sulfonyl, R and D are both 1,2naphthoquinone-2-diazide groups, $p$ is 1 and $m$ is 2, which can be represented by the following structural formula:

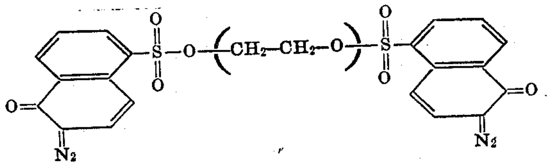

where n is as defined above.

The polyalkylene glycol quinone diazides are prepared by reacting a polyalkylene glycol such as polyethylene glycol, polypropylene glycol or polytetramethylene glycol with a suitable reactive quinone diazide such as a quinone diazide acid ester or acid halide, e.g., a quinone diazide sulfonyl chloride, a quinone diazide carbonyl chloride, a quinone diazide carboxylic acid chloride, a quinone diazide sulfinyloxy chloride, and the like. This reaction is typically carried out in a teriary amine solvent such as pyridine, picoline, lutidine, triethylamine, and the like, under ambient conditions or at reduced or elevated temperature. The polyalkylene glycol quinone diazide can be collected by neutralizing the reaction mixture with a dilute acid, such as hydrochloric acid, and extracting it with a halogenated solvent such as methylene chloride, dichloroethane, 1,1,1,-trichloroethane, and the like.

The quinone diazide acid halides which are useful in the preparation of the polymers of the invention can differ in their constitution very widely, provided the compound contains at least one light-sensitive o-quinone diazide moiety. Especially advantageous are compounds of the benzene series carrying one or more o-quinone diazide groupings, such as acid halides of such quinone diazides as o-benzoquinone diazide, 1,2-napthoquinone-1diazide, 1,2-naphthoquinone-2-diazide, 7-methoxy-1,2-naphthoquinone-2-diazide, 6-chloro-1,2-naphthoquinone-2-diazide, 7-chloro-1,2-naphthoquinone-2-diazide, 6-nitro-1,2-naphthoquinone-2-diazide, 5-(carboxymethyl)-1,2-naphthoquinone-1-diazide, 3,3′, 4,4′-diphenyl-bis-quinone-4,4′-diazide, 2,3-phenanthrenequinone-2-diazide, 9,10-phenanthrenequinone-10-diazide and 3,4-chrysenequinone-3-diazide.

The polyalkylene glycols employed to prepare the light-sensitive polymeric quinone diazides of this invention are water-soluble materials having repeating polyether units terminating in hydroxyl groups and having an average molecular weight of about 500 to about 50,000. These polymers can be homopolymers having, as the sole repeating unit, units derived from ethylene glycol, propylene glycol, tetramethylene glycol, etc., or they can be copolymers containing mixtures of such repeating units with one another or with other copolymerizable monomers. The polyethylene glycol homopolymers, which are available commercially under the trademark "Carbowax", are particularly preferred and will be used hereinafter as representatives of the polyalkylene glycols useful in this invention. Polyethylene glycols having average molecular weights of about 600 to 4,000 are especially preferred for preparation of the light-sensitive polymers of this invention which are employed in conjunction with another polymer which is either non-light-sensitive, such as a phenolic resin, or light sensitive, such as another polymeric quinone diazide.

Coating compositions containing the light-sensitive polymeric quinone diazides of this invention can be prepared by dispersing or dissolving the polymer in any suitable solvent or combination of solvents used in the art to prepare polymer dopes which is unreactive toward the light-sensitive materials and which is substantially incapable of attacking the substrate employed. Exemplary solvents include, cyclohexane, methyl Cellosolve acetate, cyclohexanone, acetonitrile, 2-ethoxyethanol, acetone, 4-butyrolactone, ethylene glycol monomethyl ether acetate and mixtures of these solvents with each other or with one or more of the lower alcohols and ketones.

The concentrations of the coating solutions are dependent upon the particular light-sensitive material employed as well as the support and the coating method employed. Particularly useful coatings are obtained when the coating solutions contain about 1 to 50 percent by weight, and preferably about 2 to 10 percent weight, of light-sensitive polymeric quinone diazide. Higher concentrations, of course, give satisfactory results.

It will be recognized that additional components can be included in the coating formulation with the polymeric quinone diazides. For example, dyes or pigments may be included to obtain colored images to aid in recognition. Alizarine dyes and azo dyes are particularly suited. Pigments such as Victoria Blue (Color Index Pigment Blue I), Palomar Blue (Color Index Pigment Blue 15) and Watchung Red B (Color Index Pigment Red 48) may also be used. One method of providing particularly good recognition of image areas comprises the use of a printout material with an inert dye. For example, a green colored inert dye such as Alizarine Cyanine Green GHN Conc. (Color Index Acid Green 25) in combination with an azide printout material such as diazidostilbenedisulfonic acid disodium salt produces a yellow colored printout on a green background. Other components which can be advantageously included in the coating compositions are materials which serve to improve film formation, coating properties, adhesion of the coatings to the supports employed mechanical strength, stability, etc.

Particularly advantageous coating compositions contain at least one other film-forming polymeric resin in addition to the polyalkylene glycol quinone diazide. These additional polymeric resins can be light-sensitive or non-light-sensitive and are usually selected from those resins which are soluble in the coating solvent. The amounts of resins employed will vary with the particular resin, useful results being obtained with coatings containing from 0.5 to 50 parts by weight of resin per part of polyalkylene glycol quinone diazide.

In one embodiment of this invention, a photosensitive composition is prepared by combining a polymeric quinone diazide of this invention with a non-light-sensitive film-forming resin. Particularly useful non-light-sensitive film-forming resins are phenol-formaldehyde or phenolic resins such as those known as novolac or resole resins and those described in Chapter XV of "Synthetic Resins in Coatings," H. P. Preuss, Noyes Development Corporation (1965), Pearl River, New York. The o-cresol-formaldehyde resins, such as produced in accordance with German Patent 281,454 are especially preferred.

The novolac resins are prepared by the condensation of phenols and aldehydes under acidic conditions whereas the resole resins are prepared under basic conditions. Less than 6 moles of formaldehyde are used per 7 moles of phenol to provide products which are permanently fusible and soluble. In a typical synthesis, novolacs are prepared by heating 1 mole of phenol with 0.5 mole of formaldehyde under acidic conditions. The temperatures at which the reaction is conducted are generally from about 25° C. to about 175° C.

These resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxy-phenol, chlorophenol, resorcinol, hydroquinone, naphthol, 2,2-bis(p-hydroxyphenyl)propane and the like. Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable phenolic resins are those which are insoluble in water and trichloroethylene but readily soluble in conventional organic solvents such as methyl ethyl ketone, acetone, methanol, ethanol, etc. Phenolic resins having a particularly desirable combination of properties are those which have an average molecular weight in the range between about 350 and 40,000.

In another embodiment of this invention a photosensitive composition is prepared by combining a polyalkylene glycol quinone diazide of this invention with another light-sensitive polymer. Particularly useful light-sensitive polymers are other polymeric quinone diazides, such as the condensation product of a sulfonic acid halide of a quinone-(1,2)-diazide and a phenol-formaldehyde resin described in U.S. Pat. No. 3,046,120, the ester of a naphthoquinone-(1,2)-diazide sulfonic acid in which the ester is the residue of a polymeric phenol derived by interaction of a polyhydric phenol and a ketone, in particular pyrogallol and acetone, as described in British Pat. Specification No. 1,113,759, and polymeric quinone diazides having quinone diazide groups appended to a polymer backbone through a nitrogen atom which are described in the above-mentioned abandoned U.S. Pat. application Ser. No. 684,636, filed Nov. 21, 1967.

The light-sensitive polyalkylene glycol quinone diazides can be mixed in any proportion with a film-forming resin to form resists or lithographic materials. When it is mixed with another light-sensitive resin, it may be used to modify the light sensitivity of the coating or modify its physical characteristics, or both. For example, when incorporated in brittle polymeric quinone diazide coatings it can be used as a plasticizer to impart flexibility to the coating. In such instances, the amount of polyalkylene glycol quinone diazide can be very small and constitute as little as 5 percent by weight of the light-sensitive polymer in the composition.

Photosensitive elements bearing layers of the polymeric quinone diazides can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The supports, and especially polymeric supports such as poly(ethylene terephthalate), can be subcoated with materials which aid adhesion to the support. A preferred class of subcoatings are polymers, copolymers and terpolymers of vinylidene chloride alone or with acrylic monomers such as acrylonitrile, methyl acrylate, etc., and unsaturated dicarboxylic acids such as itaconic acid, etc. The support can also carry a filter or antihalation layer composed of a dyed polymer layer which absorbs the exposing radiation after it passes through the light-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation. The optimum coating thickness of the light-sensitive layer will depend upon such factors as the use to which the coating will be put, the particular light-sensitive polymer employed, and the nature of other components which may be present in the coating. Typical coating thicknesses for use in preparing resists can be from about 0.1 to 0.5 mils.

The photographic elements employed in our invention are exposed by conventional methods to a source of actinic radiation which is preferably a source which is rich in ultraviolet light. Suitable sources include carbon arc lamps, mercury vapor lamps, fluorescent lamps, tungsten filament lamps, lasers, and the like. The exposed elements are then developed by flushing, soaking, swabbing, or otherwise treating the light-sensitive layers with a solvent or solvent system which exhibits a differential solvent action on the exposed and unexposed materials. These developing solvents may be organic or aqueous in nature and will vary with the composition of the photographic layer to be developed. Exemplary solvents include water, aqueous alkalis, the lower alcohols and ketones, and aqueous solutions of the lower alcohols and ketones. The resulting images may then be treated in any known manner consistent with their intended use such as treatment with desensitizing etches, plate lacquers, etc.

The photoresist solution may be applied to a clean surface to be etched by spraying, dipping, whirling, etc., and air dried. If desired, a prebake of 10 to 15 minutes at 60° C. is given to remove residual solvent and the coating is exposed through a pattern to a light source. The resist coating, is then placed in a developer solvent such as an aqueous alkaline developer, to remove the exposed areas. The alkaline strength of the developer is governed by the particular polymeric quinone diazide used, other resins which may be employed and the proportions of the various components. The developer can also contain dyes and/or pigments and hardening agents. The developed image is rinsed with distilled water, dried and optionally postbaked for 15 to 30 minutes at 60° to 120° C. The substrate can then be etched by acid etching solutions such as ferric chloride.

The following examples further illustrate this invention.

EXAMPLE 1—PREPARATION OF A POLYETHYLENE GLYCOL END-CAPPED WITH 5-SULFONYL-1,2-NAPHTHOQUINONE-2-DIAZIDE

In a three-neck flask cooled in a water-ice bath to 0° C. and equipped with an air stirrer and condenser are placed 30 g. (0.05 mole) of a polyethylene glycol having an average molecular weight of 600 (Carbowax 600, sold by Union Carbide) and 22 ml. of pyridine. The stirrer is started and 29.5 g. (0.11 mole) of 1,2-naphthoquinone-2-diazide-5-sulfonyl chloride is added in portions over a 15-minute period. The reaction mixture is stirred for 2½ to 3 hours after the addition of the naphthoquinone diazide is completed. The temperature of the reaction mixture is held between 0° and 5° C. and shielded from excess light. The reaction mixture is then treated with an excess of dilute hydrochloric acid in order to neutralize the excess pyridine, and the aqueous solution is extracted with methylene chloride. The methylene chloride solution is washed with water, dried. and the volume reduced. Thirty-four grams of product (a viscous liquid) is isolated. The product has IR and NMR spectra that are consistent with a 5-sulfonyl-(1,2)-naphthoquinone-(2)-diazide end-capped polyethylene glycol.

EXAMPLE 2

In a three-neck flask maintained at 20° C. and equipped with an air stirrer and condenser are placed 20 g. (0.02 mole) of a polyethylene glycol having an average molecular weight of 1,000 (Carbowax 1000, sold by Union Carbide) and 20 ml. of pyridine. The stirrer is started and 26.8 g. (0.10 mole) of 1,2-naphthoquinone-2-diazide-5-sulfonyl chloride is added in portions over a 15-minute period. The reaction mixture is held at 20° C. for 4 hours after the naphthoquinone diazide addition is completed. The mixture is shielded from excess light. The reaction mixture is then treated with an excess of dilute hydrochloric acid in order to neutralize the excess pyridine, and the aqueous solution is extracted with methylene chloride. The methylene chloride solution is washed with water, dried and the volume reduced. Then grams of product are isolated, which has an IR spectrum that is consistent with a 5-sulfonyl-(1,2)-naphthoquinone-(2)-diazide end-capped polyethylene glycol.

EXAMPLE 3

In a three-neck flask maintained at 20° C. and equipped with an air stirrer and condenser are placed 20 g. (0.005 mole) of a polyethylene glycol having an average molecular weight of 4,000 (Carbowax 4000 sold by Union Carbide) and 20 ml. of pyridine. The stirrer is started and 8.05 g. (0.03 mole) of 1,2-naphthoquinone-2-diazide-5-sulfonyl chloride is added in portions over a 15-minute period. The reaction mixture is held at 20° C. for 4 hours after the naphthoquinone diazide addition is completed. The mixture is shielded from excess light. Ten grams of product are isolated by the procedure described in Example 1. The IR spectrum is consistent with a 5-sulfonyl-(1,2)-naphthoquinone-(2)-diazide end-capped polyethylene glycol.

EXAMPLE 4—PREPARATION OF A POSITIVE-WORKING RESIST

This example illustrates the usefulness of one of the polymers of this invention in combination with a thermoplastic cresol-formaldehyde resin (Alnovol 429 K sold by American Hoescht Co.) in forming a positive-working resist stencil. The resist formulation is compared with compositions containing a copolymer of styrene:p-aminostyrene reacted with a 1,2-naphthoquinon-(2)-diazide-5-sulfonyl chloride such as is described in Example 5 of the above-mentioned abandoned U.S. Pat. application Ser. No. 684,636, filed Nov. 21, 1967, and a thermoplastic cresol-formaldehyde resin (Alnovol 429 K sold by the American Hoescht Co.) The formulations are prepared having the following composition:

| Component | Formulation | | |
|---|---|---|---|
| | A | B | C |
| Polymer of Example 1 | 100 g. | | |
| Polymer of Example 5 of Ser. No. 684,636 | | 62.4 g. | 124.8 g. |
| Cresol-formaldehyde Resin (Alnovol 429 K) | 250 g. | 268 g. | 268 g. |
| Sudan IV Dye (CI 26105) | 1.0 g. | 1.0 g. | 1.0 g. |
| Methyl Cellosolve Acetate | 800 cc. | 1,000 cc. | 1,000 cc. |
| Monochlorobenzene | 200 cc. | | |

The formulations are filtered by gravity through filter paper and coatings are prepared by whirler coating the formulations at 100 to 140 r.p.m. for 30 minutes on copper plates. Coatings of these formulations are prebaked at 70°, 80°, 90°, ad 100° C. for 30 minutes. The dried coatings are exposed through a 0.15 log E density step tablet for 8 minutes to a 95-amp carbon arc at a distance of four feet and then tray developed for 2 minutes using an alkaline developer containing 30 grams of anhydrous sodium silicate, 8 grams of sodium hydroxide and 0.6 grams of a surfactant (Triton X 100, Rohm & Haas) per liter of water. The coatings on copper after development are evaluated for photographic speed and general appearance. The results of the evaluation are as follows:

| Prebake | | Photographic Speed | | |
|---|---|---|---|---|
| Time (min.) | Temp. °C.) | 1st Solid Step After Development A | B | C |
| 30 | 70 | 0.81 | — | — |
| 30 | 80 | 0.67 | — | 0.20 |
| 30 | 90 | 0.81 | 2.00 | 0.20 |
| 30 | 100 | 0.67 | 1.85 | 0.20 |

The coatings prepared from Formulation A PRODUCE IMAGES OF GOOD GLOSS AND ADHESION WITH NO VISIBLE PINHOLES. Essentially, there is no change in photographic speed over a prebake range of 30° C. In the case of the coating prepared from Formulations B and C, the speed could not be determined at 70° C. prebake due to removal of the coating during development. The coating from Formulation C indicated no change in photographic speed when prebaking from 80° to 100° C., however, there is a micro layer of scum which would be removed during $FeCl_3$ etching. The processed coating from Formulation A which was prebaked at 80° C. is tray etched in $FeCl_3$ (42° Be) at room temperature for 1 hour. There is no visible pinholing after 6–8 mils etch depth. Under the same condition the coatings prepared from Formulation C showed scattered small pinholes.

EXAMPLE 5—POSITIVE-WORKING RESISTS

This example illustrates the use of photoresist compositions containing light-sensitive polymers of this invention in combination with a thermoplastic cresol-formaldehyde resin. Formulations are prepared having the following compositions:

| Component | Formulation | |
|---|---|---|
| | D | E |
| Polymer of Example 2 | 50 g. | |
| Polymer of Example 3 | — | 50 g. |
| Cresol-formaldehyde resin (Alnovol 429K) | 150 g. | 150 g. |
| Methyl Cellosolve Acetate | 500 cc. | 500 cc. |
| Dichloromethane | 500 cc. | 500 cc. |

The formulations are filtered through filter paper and the coatings are prepared by whirler coating at 80 r.p.m. for 30 minutes on copper plates. The coatings are exposed and developed as described in Example 4, except that exposure is for 10 minutes and the developer compositions are modified as follows:

| Developer Composition | For use with Formulation | |
|---|---|---|
| | D | E |
| Sodium Hydroxide | 16 g. | 13 g. |
| Anhydrous Sodium Silicate | 60 g. | 50 g. |
| Surfactant (Triton X-100) | 1.2 g. | 1 g. |
| Water to make | 1 liter | 1 liter |

The coatings prepared from the above formulations produce images of good gloss and adhesion with no visible pinholes. The coatings are not postbaked. They are tray etched in ferric chloride (40° Be) at room temperature for 5 minutes. There is no visible pinholing after etching to 1 mil depth.

EXAMPLE 6—POSITIVE-WORKING RESIST BASED ON TWO LIGHT-SENSITIVE POLYMERS

This example illustrates the use of a photoresist composition containing a polymer of this invention in combination with another light-sensitive polymeric quinone diazide prepared as described in Example 5 of the above-mentioned abandoned U.S. Pat. application Ser. No. 684,636 and a thermoplastic cresol-formaldehyde resin and compares it with a similar composition which uses an epoxy resin (EPON 836, sold by Shell) in place of the light-sensitive polymer of this invention. The formulations are prepared having the following compositions:

| Component | Formulation | |
|---|---|---|
| | F | G |
| Polymer of Example 1 | 60.0 g. | |
| Epoxy Resin (EPON 836) | | 20 g. |
| Polymer of Example 5 of Ser. No. 684,636 | 62.4 g. | 62.4 g. |
| Cresol-formaldehyde Resin (Alnovol 429K) | 268.0 g. | 268.0 g. |
| Sudan IV Dye (CI 26105) | 1.0 g. | 1.0 g. |
| Methyl Cellosolve Acetate | 1,000 cc. | 1,000 cc. |

The formulations are coated, developed and evaluated by the procedure described in Example 4 except that Formulation G is exposed for 4 minutes. The results of the evaluation are as follows:

| Prebake | | Photographic Speed | |
|---|---|---|---|
| Temp. (°C.) | Time (Min.) | F | G |
| 70 | 30 | 0.36 | 1.87 |
| 80 | 30 | 0.36 | 0.97 |
| 90 | 30 | 0.36 | 0.67 |
| 100 | 30 | 0.36 | 0.20 |

The coating prepared from Formulation F produce images of good gloss and adhesion with no visible pinholes. At the 100° C. prebake, the nonimage areas have very slight striated scum streaks which are readily removed on etching in aqueous $FeCl_3$. There is no change in photographic speed with prebake which is indicative of superior prebake latitude. In the case of the coatings from Formulation G, the photographic speed changes with prebake conditions. The final images indicated good gloss and adhesion with no visible pinholes. The coatings prepared from Formulation F have superior prebake and development latitude. There is no discernible pinholing after etching the plates in aqueous $FeCl_3$ as is obtained with Formulation G. The coatings prepared from Formulation F do not appear to be as brittle as the coatings prepared from Formulation G as observed by an abrasion test.

The invention has been described in detail with particular reference to preferred embodiments thereof, but it will be understood that variations and modifications can be effected within the spirit and scope of the invention.

What is claimed is:

1. A light-sensitive o-quinone diazide end-capped polyalkylene glycol containing substantially no free hydroxyl groups, which on exposure to actinic radiation undergoes substantially no crosslinking.

2. The polymer of claim 1 wherein the polyalkylene glycol has an average molecular weight of 500 to 50,000.

3. A light-sensitive o-quinone diazide end-capped polyethylene glycol containing substantially no free hydroxyl groups, which on exposure to actinic radiation undergoes substantially no crosslinking.

4. A light-sensitive 1,2-naphthoquinone-2-diazide end-capped polyethylene glycol containing substantially no free hydroxyl groups, which on exposure to actinic radiation undergoes substantially no crosslinking.

5. The polymer of claim 4 wherein the polyethylene glycol has an average molecular weight of 600 to 4,000.

6. A light-sensitive polymer which on exposure to actinic radiation undergoes substantially no crosslinking having the formula:

$$R-(X)_p-O-[(CH_2)_m-O]_n-X-D$$

wherein X is selected from the group consisting of sulfonyl, carbonyl, carbonyloxy, and sulfinyloxy linkages; D is an o-quinone diazide group of the benzene series; R is selected from the group consisting of a D group, a hydrogen atom, an alkyl group and an aryl group; *p* is O when R is a hydrogen atom and is 1 when R is a D group, an alkyl group or an aryl group; m is an integer of 2 through 4: and *n* is an integer of about 8 through 400.

7. A light-sensitive polymer as defined in claim 6 having the formula:

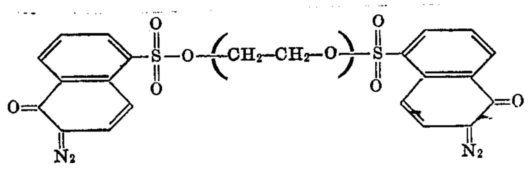

wherein *n* is an integer of about 8 through 400.

8. A light-sensitive polymer as defined in claim 7 wherein n is integer of about 10 through 100.

9. An alkali insoluble photosensitive coating composition comprising a solution in an organic solvent of a film-forming resin and an o-quinone diazide end-capped polyalkylene glycol, where on exposure to actinic radiation the composition is rendered soluble in dilute alkali and undergoes substantially no crosslinking.

10. A photosensitive coating composition as defined in claim 9 wherein the o-quinone diazide end-capped polyalkylene glycol is a 1,2-naphthoquinone-2 -diazide end-capped polyethylene glycol.

11. A photosensitive coating composition as defined in claim 9, wherein the film-forming resin is a phenolic resin.

12. A photosensitive coating composition as defined in claim 9, wherein the o-quinone diazide end-capped polyalkelene glycol has the formula:

$$R-(X)_p-O-[(CH_2)_m-O]_n-X-D$$

wherein X is selected from the group consisting of sulfonyl, carbonyl, carbonyloxy, and sulfinyloxy linkages; D is an o-quinone diazide group of the benzene series; R is selected from the group consisting of a D group, a hydrogen atom, an alkyl group and an aryl group; p is O when R is a hydrogen atom and is 1 when R is a D group, an alkyl group or an aryl group; m is an integer of 2 through 4; and n is an integer of about 8 through 400.

13. A photosensitive coating composition as defined in claim 12, wherein the film-forming resin is a phenolic novolac resin.

14. A photosensitive coating composition as defined in claim 12, wherein the o-quinone diazide end-capped polyalkylene glycol has the formula:

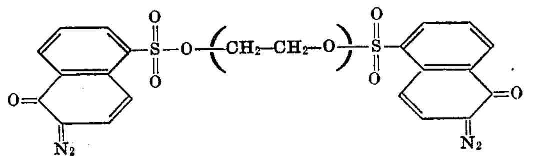

wherein *n* is an integer of about 10 to 100.

15. A photosensitive coating composition as defined in claim 13, wherein the film-forming resin is an o-cresol-formaldehyde resin.

16. A photosensitive coating composition as defined in claim 9, wherein the film-forming resin is a light sensitive polymeric o-quinone diazide which is rendered soluble in dilute alkali on exposure to actinic radiation.

17. A photosensitive element comprising a support bearing a solid, alkali insoluble layer comprising a film-forming resin and a light-sensitive o-quinone diazide end-capped polyalkylene glycol, which layer on exposure to actinic radiation is rendered soluble in dilute alkali and undergoes substantially no crosslinking.

18. A photosensitive element as defined in claim 17, wherein the o-quinone diazide end-capped polyalkylene glycol has the formula:

$$R-(X)_p-O-[(CH_2)_m-O]_n-X-D$$

wherein X is selected from the group consisting of sulfonyl, carbonyl, carbonyloxy, and sulfinyloxy linkages; D is an o-quinone diazide group of the benzene series; R is selected from the group consisting of a D group, a hydrogen atom, an alkyl group and an aryl group; *p* is O when R is a hydrogen atom and is 1 when R is a D group, an alkyl group or an aryl group; *m* is an integer of 2 through 4; and *n* is an integer of about 8 through 400.

19. A photosensitive element as defined in claim 17, wherein the film forming resin is a light-sensitive polymeric o-quinone diazide which is rendered soluble in dilute alkali on exposure to actinic radiation.

20. A photosensitive element as defined in claim 17, wherein the film-forming resin is a phenolic resin.

21. A photosensitive element as defined in claim 20 wherein the support is a metallic support.

22. A photosensitive element as defined in claim 20 wherein the support is a metal coated glass support.

23. A process for preparing a photomechanical image which comprises exposing to actinic radiation a photosensitive element comprising a support bearing a solid alkali insoluble layer comprising a film-forming resin and a light sensitive o-quinone diazide end-capped polyalkylene glycol, which on exposure to actinic radiation undergoes substantially no crosslinking, to decompose the quinone diazide structure and render the exposed areas of the layer soluble in dilute alkali and developing a positive image by removing the exposed areas of the layer with an aqueous alkaline developer.

* * * * *

PO-1050
(5/69)

UNITED STATES PATENT OFFICE
CERTIFICATE OF CORRECTION

Patent No. 3,647,443 Dated March 7, 1972

Inventor(s) Frederick J. Rauner, Joseph A. Arcesi and John R. Guil[illegible]

It is certified that error appears in the above-identified patent and that said Letters Patent are hereby corrected as shown below:

Column 3, line 1,

Column 9, line 55 and

Column 10, line 22, the structural formula should read

--- 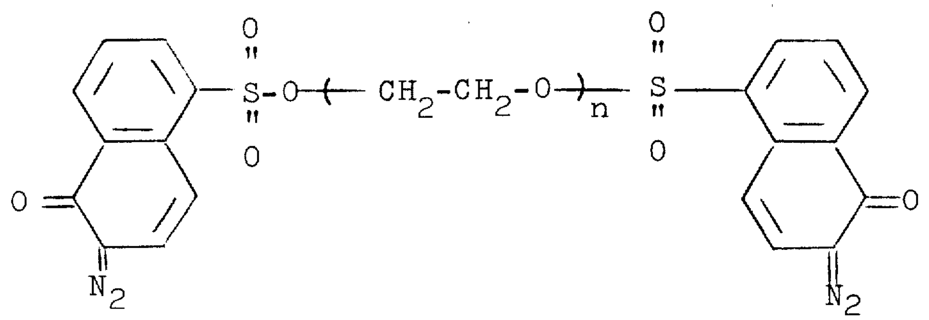 ---.

Signed and sealed this 27th day of June 1972.

(SEAL)
Attest:

EDWARD M.FLETCHER,JR.
Attesting Officer

ROBERT GOTTSCHALK
Commissioner of Patents